United States Patent
Kim et al.

(10) Patent No.: US 11,665,965 B2
(45) Date of Patent: May 30, 2023

(54) COMPOSITION FOR FORMING A THERMOELECTRIC FILM AND THERMOELECTRIC FILM CONTAINING THE SAME

(71) Applicant: Korea Institute of Machinery & Materials, Daejeon (KR)

(72) Inventors: Kyung Tae Kim, Busan (KR); Byung Mun Jung, Changwon-si (KR)

(73) Assignee: KOREA INSTITUTE OF MATERIALS SCIENCE, Changwon-si (KR)

( * ) Notice: Subject to any disclaimer, the term of this patent is extended or adjusted under 35 U.S.C. 154(b) by 196 days.

(21) Appl. No.: 16/595,568

(22) Filed: Oct. 8, 2019

(65) Prior Publication Data

US 2020/0168779 A1 May 28, 2020

(30) Foreign Application Priority Data

Oct. 16, 2018 (KR) .................. 10-2018-0123223

(51) Int. Cl.
*H01L 35/26* (2006.01)
*H01L 35/34* (2006.01)

(52) U.S. Cl.
CPC .............. *H01L 35/26* (2013.01); *H01L 35/34* (2013.01)

(58) Field of Classification Search
CPC .................................................... H01L 35/34
See application file for complete search history.

(56) References Cited

U.S. PATENT DOCUMENTS

2006/0118158 A1* 6/2006 Zhang ............... H01L 35/34
136/205
2018/0108449 A1* 4/2018 Kim ..................... B22F 9/24

FOREIGN PATENT DOCUMENTS

| JP | 2016-199434 | 12/2016 | |
| KR | 10-1292591 | 8/2013 | |
| KR | 10-2015-0119271 | 10/2015 | |
| KR | 10-2017-0114568 | 10/2017 | |
| WO | WO-2016076649 A1 * | 5/2016 | ............ B22F 1/0018 |

OTHER PUBLICATIONS

Kim et al., (Investigation on the thermoelectric properties of Bismuth Telluride Matrix composites by addition of graphene oxide powders), Journal of Korean Powder Metallurgy Institute vol. 23 No. 4 pp. 263-269 (Year: 2016).*

Park et al., (Highly dispersible edge-selectively oxidized graphene with improved electrical performance), Carbon Nanomaterials Design Laboratory, Research Institute of Advanced Materials, and Department of Materials Science and Engineering, Seoul National University (Year: 2016).*

* cited by examiner

*Primary Examiner* — Niki Bakhtiari
(74) *Attorney, Agent, or Firm* — Lex IP Meister, PLLC

(57) ABSTRACT

Disclosed is a composition for forming a thermoelectric film, the composition comprising an edge-oxidized graphene oxide, wherein the edge-oxidized graphene oxide is dispersed in a thermoelectric material.

5 Claims, 10 Drawing Sheets

COMPOSITION FOR FORMING A THERMOELECTRIC FILM AND THERMOELECTRIC FILM CONTAINING THE SAME

CROSS-REFERENCES TO RELATED APPLICATION

This patent application claims the benefit of priority from Korean Patent Application No. 10-2018-0123223, filed on Oct. 16, 2018, the contents of which are incorporated herein by reference.

BACKGROUND OF THE INVENTION

1. Field of the Invention

The present disclosure relates to a composition for forming a thermoelectric film and a thermoelectric film containing the same.

2. Description of the Related Art

Thermoelectric technology is a mutually reversible energy converting technology with which electricity is generated through a temperature difference or conversely, a temperature difference is generated by using potential difference. Thermal energy harvesting with which electricity is obtained from discharged or waste heat is enabled by using the Seebeck effect that is a thermoelectric phenomenon in which when a temperature difference is present, electricity is generated. Conversely, when using the Peltier effect with which a temperature difference is obtained through a potential difference, application to active cooling and precise temperature control is enabled. Such thermoelectric phenomena are easily implemented mostly in materials having semiconductor characteristics. The thermoelectric energy conversion performance of a thermoelectric material is expressed by a ZT (Formula 1 below) which is a dimensionless figure-of-merit.

$$ZT = \frac{\sigma \alpha^2}{\kappa} T \qquad \langle \text{Formula 1} \rangle$$

(σ: Seebeck coefficient, α: electrical conductivity, κ: thermal conductivity, T: absolute temperature)

The thermoelectric phenomenon is used in the form of a thermoelectric element in which p-type and n-type thermoelectric materials are regularly arrayed. Among various forms of thermoelectric elements, vertical-type thermoelectric elements which are most widely being used may be classified, according to thicknesses thereof, into a bulk type of at least several mm, a thin film type of several ten μm, and a thick film type of several hundred μm. Recently, according to an increase in the demand for thermal management of electronic devices which become lightweight, thin, short, and small, and for self power generation using human body heat, development of a thermoelectric element which is thin and has superior performance has been essentially required. However, in case of a thin film element among vertical-type thermoelectric elements, it is difficult to continuously maintain the temperature difference between upper and lower side in ther element, and in case of a bulk-type thermoelectric element, it is relatively easy to maintain a temperature difference, but there is a limitation in practical use due to a large volume.

Thus, attention has been focused on a thick film type (thickness of approximately 500 μm) in an aspect that can secure both of the merits of relatively small thickness and superior physical property.

Even in previous arts, research has been carried out in which thermoelectric powder is synthesized into the form of paste or ink and then a thick film-type thermoelectric material is manufactured through a screen printing process. However, due to a lower thermoelectric performance index than a bulk material and particularly, due to low electrical conductivity in most results, the thick film-type thermoelectric element is limited in practical application despite its high necessity.

In particular, when the electrical conductivity σ is low, Joule heat is generated due to resistance so that power generation using a temperature difference is not efficiently performed, and thus, there is a limitation in using the thick film-type thermoelectric element for power generation. Actually, in case of existing flexible thermoelectric materials manufactured by using a thermoelectric paste printing technique for the use in thermoelectric power generation using human body heat and the like, the power factor σ·α² which is the product of electrical conductivity and the Seebeck coefficient is remarkably lower than that of a bulk-type material, and thus there is a limitation in practicality. In general, the electrical property of the thermoelectric thick film material manufactured through a paste printing process is at most 1/10 of that of the bulk-type material. The reason for this is due to the residual problem of a non-conductive organic binder material included in a paste and the problem of generation of a great number of pores formed in the thick film thermoelectric film caused by the residue problem. Thus, the development of a thick film-type thermoelectric material which solves the pore problem formed inside the thick film-type thermoelectric film and has an electrical property close to and comparable to that of a bulk material is the core in expanding application range of thermoelectric elements.

In particular, since a high thermoelectric performance index of a thermoelectric material means that energy conversion efficiency of the thermoelectric material is high, it is a prerequisite condition (see Formula 2) for improvement in the thermoelectric performance index to maintain or improve the Seebeck coefficient α as well as the improvement in electrical conductivity.

$$\alpha = \frac{8\pi^2 k_B^2}{3eh^2} m^* T \left(\frac{\pi}{3n}\right)^{2/3} \qquad \langle \text{Formula 2} \rangle$$

$$\sigma = q\mu n$$

(α: Seebeck coefficient, m*: charge effective mass, σ: electrical conductivity, n: charge density, μ: charge mobility)

Conventionally, a method for improving the charge density n by adding a dopant into thermoelectric ink and a paste has been most widely used in order to improve electrical properties. However, when the value of n rapidly increases, as shown in Formula 2 above, the electrical conductivity increases, whereas a decrease in the Seebeck coefficient is accompanied, and thus, in order to totally improve the value of σ·α2, there is a limit only with doping. Therefore, there is a high interest in a technique for securing suitable modulation of the electrical conductivity and the Seebeck coefficient by controlling only the charge mobility μ while appropriately maintaining the charge density n. Thus, even in improving the physical property of the thick film-type thermoelectric material, improvement in the electrical conductivity σ and the control of the Seebeck coefficient α due to the charge mobility μ are core technical issues.

PRIOR ART DOCUMENT

Patent Document (Patent document 1) Korean Patent No. 10-1292591 B1

SUMMARY OF THE INVENTION

One object of the present invention is to solve the pore problem and a low electrical property which occur in manufacturing a thick film-type thermoelectric film using an existing thermoelectric powder paste. In order to solve the abovementioned problem, the inventors of the present invention intend to provide a thick film-type thermoelectric material having a superior electrical property by mixing a two-dimensional graphene material with a thermoelectric material (or thermoelectric powder) to obtain a paste, and manufacturing a thick film through a printing process using the paste.

In order to achieve the objects, in one aspect of the present invention, there is provided a composition for forming a thermoelectric film, the composition including an edge-oxidized graphene oxide, wherein the edge-oxidized graphene oxide is dispersed in a thermoelectric material.

In addition, in another aspect of the present invention, there is provided a thermoelectric film including an edge-oxidized graphene oxide, wherein the edge-oxidized graphene oxide is dispersed in a thermoelectric material.

Furthermore, in still another aspect of the present invention, there is provided a method for manufacturing a thermoelectric film, the method including: manufacturing a composition for forming a thermoelectric film, the composition including an edge-oxidized graphene oxide, wherein the edge-oxidized graphene oxide is dispersed in a thermoelectric material; and manufacturing a thermoelectric film by applying the composition for forming a thermoelectric film.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

In one aspect of the present invention, there is provided a composition for forming a thermoelectric film, the composition including an edge-oxidized graphene oxide, wherein the edge-oxidized graphene oxide is dispersed in a thermoelectric material.

Hereinafter, a composition for forming a thermoelectric film provided in one aspect of the present invention will be described in detail.

Figure 1:
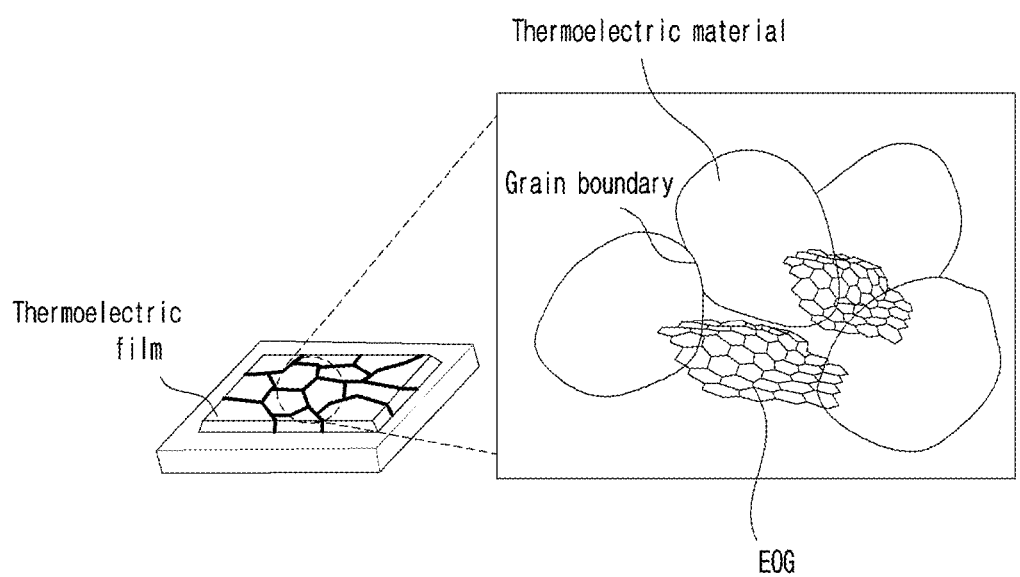
FIG. 1 is a schematic view indicating a form in which a thermoelectric material and an edge-oxidized graphene oxide (EOG) are present in a composition.

A composition for forming a thermoelectric film provided in one aspect of the present invention has an effect of improving electrical conductivity by dispersing an edge-oxidized graphene oxide (EGG) among two-dimensional graphenes in a thermoelectric material and thus connecting between grains of the thermoelectric material (or thermoelectric powder) present in a non-sintered state (see FIG. 1). Simultaneously, scattering of lattice phonons is generated by forming a new grain boundary between the graphene oxide and the thermoelectric material, and thus, the lattice thermal conductivity may also be reduced.

In particular, when forming a film by changing thermoelectric powder into an ink or a paste, a low electrical property is exhibited due to pores and the like formed by residue of used organic materials or rapid volatilization of the organic materials. However, the composition of the present invention solves the problem of degradation in electrical property due to pores by effectively connecting, with EOGs having high charge mobility, free space between thermoelectric materials inside the composition formed during a process. Since the EOG is added not as a dopant that remarkably changes the charge density inside the thermoelectric film but as an additive, the EOG may induce improvement in electrical conductivity through a quick charge movement without remarkably changing the charge density.

At this point, the edge-oxidized graphene oxide may have a graphene edge portion oxidized by 5-50%, 5-30%, 5-10%, 10-50%, 10-30%, or 30-50%. When the graphene edge portion of the graphene oxide is oxidized by less than 5%, there is a problem in that the oxidized graphene material is coupled with the thermoelectric material or is not easily dispersed inside the film, and when oxidized by greater than 50%, there is a problem in that not only it is difficult to prevent formation of defect on a surface during edge oxidization, but also connectivity inside the graphene material is disconnected. In general, the oxidization degree and the reference that indicates the oxidization degree of an edge portion may be different according to methods for manufacturing an edge-oxidized graphene oxide.

In addition, as the thermoelectric material, a Bi—Te based compound, an Sb—Te based compound, a Bi—Sb—Te based compound, a Bi—Te—Se based compound, a Co—Sb based compound, a Pb—Te based compound, a Ge—Tb based compound, an Si—Ge based compound or an Sm—Co based compound may be used, but the thermoelectric material is not limited thereto, and it is favorable to use the Bi—Te based compound as the thermoelectric material.

The content of the edge-oxidized graphene oxide in the composition for forming a thermoelectric film may be 0.05-10, 0.2-10, 0.2-7, 0.2-5, 0.4-4, 0.8-3, 0.8-2, 1-2, 1-1.8, or 1.5-1.8 parts by weight with respect to 100 parts by weight of total composition. When the content of the edge-oxidized graphene oxide in the composition for forming a thermoelectric film is less than 0.2 parts by weight with respect to 100 parts by weight of the total composition, there is a problem in that a bridging effect between the thermoelectric materials is not easily exhibited, and when exceeding 10 parts by weight, there is a problem in that it is difficult to effectively disperse the graphene oxides inside the thermoelectric material.

The composition for forming a thermoelectric film may contain a binder, and the binder may be used without a limitation as long as the binder may be formed into an ink or a paste.

In addition, in another aspect of the present invention, there is provided a thermoelectric film including an edge-oxidized graphene oxide, wherein the edge-oxidized graphene oxide is dispersed in a thermoelectric material.

Hereinafter, a thermoelectric film provided in another aspect of the present invention will be described in detail.

The thermoelectric film is a thermoelectric film applicable to a thick film-type element, and the thickness of the thermoelectric film is favorably 100-900 μm, and may be 200-800 μm, 300-700 μm, or 400-600 μm.

At this point, the edge-oxidized graphene oxide may have a graphene edge portion oxidized by 5-50%, 5-30%, 5-10%, 10-50%, 10-30%, or 30-50%. When the graphene edge portion of the graphene oxide is oxidized by less than 5%, there is a problem in that the oxidized graphene material is coupled with the thermoelectric material or is not easily dispersed inside the film, and when oxidized by greater than 50%, there is a problem in that not only it is difficult to prevent formation of defect on a surface during edge oxidization, but also it is difficult to oxidize the edge portion of the graphene material and carbon-carbon bonds on the basal plane of the graphene are also disconnected.

In addition, as the thermoelectric material, a Bi—Te based compound, an Sb—Te based compound, a Bi—Sb—Te based compound, a Bi—Te—Se based compound, a Co—Sb based compound, a Pb—Te based compound, a Ge—Tb based compound, an Si—Ge based compound or an Sm—Co based compound may be used, but the thermoelectric material is not limited thereto, and it is favorable to use the Bi—Te based compound as the thermoelectric material.

The content of the edge-oxidized graphene oxide in the thermoelectric film may be 0.05-10, 0.2-10, 0.2-7, 0.2-5, 0.4-4, 0.6-3, 0.6-3, 0.6-2, 1-3, 1-2.5, 1.4-3, 1.4-2.5 or 1.8-2.5 parts by weight with respect to 100 parts by weight of the total film. When the content of the edge-oxidized graphene oxide in the thermoelectric film is less than 0.2 parts by weight with respect to 100 parts by weight of the total composition, there is a problem in that a bridging effect between the thermoelectric materials is not easily exhibited, and when exceeding 10 parts by weight, there is a problem in that it is difficult to effectively disperse the graphene oxides inside the thermoelectric material.

Furthermore, in still another aspect of the present invention, there is provided a method for manufacturing a thermoelectric film, the method including: manufacturing a composition for forming a thermoelectric film, the composition including an edge-oxidized graphene, wherein the edge-oxidized graphene oxide is dispersed in a thermoelectric material; and manufacturing a thermoelectric film by applying the composition for forming a thermoelectric film.

Hereinafter, a method for manufacturing a thermoelectric film provided in still another aspect of the present invention will be described in detail.

First, a method for manufacturing a thermoelectric film provided in still another aspect of the present invention includes manufacturing a composition for forming a thermoelectric film, the composition including an edge-oxidized graphene oxide, wherein the edge-oxidized graphene oxide is dispersed in a thermoelectric material.

The composition for forming a thermoelectric film is the same as described above and the detailed description thereon will be omitted. The composition for forming a thermoelectric film may be manufactured in an ink or a paste in order to manufacture a thermoelectric film in later steps.

The method for manufacturing a thermoelectric film provided in still another aspect of the present invention includes manufacturing a thermoelectric film by applying the composition for forming a thermoelectric film.

In the above step, the thermoelectric film is formed by using a composition for forming a thermoelectric film.

Specifically, the thermoelectric film may be manufactured by using the composition for forming a thermoelectric film through a method such as printing or coating, and as a specific example, a method such as hand printing or screen printing may be performed.

In addition, the manufacturing of a thermoelectric film may further include heat treatment, wherein the heat treatment may be performed through a first heat treatment step performed at a temperature of 40-80° C. and a second heat treatment step performed at a temperature of 350-450° C. The first heat treatment step may be performed for 1-3 hours, and the second heat treatment step may be performed for 3-5 hours.

Hereinafter, the present invention will be described in detail through examples and experimental examples.

However, the examples and comparative examples below are merely for description of the present invention, and the contents of the present invention are not limited by the examples and the experimental examples.

<Example 1> Thin Film Manufacturing-1

Step 1: A thermoelectric film forming paste was manufactured by mixing: a paste in which 0.3 wt % of an edge-oxidized graphene oxide (EGG) and water were mixed; 20 wt % of an organic binder (1 wt % of ethyl cellulose and 99 wt % of α-terpineol); and 79.6 wt % of thermoelectric powder composed of Bi—Sb—Te.

Step 2: A thick film-shaped thermoelectric film was manufactured by manually printing the thermoelectric film forming paste manufactured in step 1 above by a thickness of 400 μm, removing the organic binder present inside through two-stage heat treatment (at a temperature of 60° C. for two hours and at a temperature of 400° C. for four hours), and performing sintering between thermoelectric powder particles. When the graphene oxide used for manufacturing remains as it is, the EOG inside the thermoelectric film is approximately 0.4 wt %.

<Example 2> Thin Film Manufacturing-2

A thermoelectric film was manufactured by performing example 1 in the same manner except for using 0.6 wt % of EOG in step 1 of example 1 and using 79.2 wt % of the thermoelectric powder. When the graphene oxide used for manufacturing remains as it is, the EOG inside the thermoelectric film is approximately 0.8 wt %.

<Example 3> Thin Film Manufacturing-3

A thermoelectric film was manufactured by performing example 1 in the same manner except for using 0.9 wt % of EOG in step 1 of example 1 and using 78.8 wt % of the thermoelectric powder. When the graphene oxide used for manufacturing remains as it is, the EOG inside the thermoelectric film is approximately 1.2 wt %.

<Example 4> Thin Film Manufacturing-4

A thermoelectric film was manufactured by performing example 1 in the same manner except for using 1.3 wt % of EOG in step 1 of example 1 and using 78.4 wt % of the thermoelectric powder. When the graphene oxide used for manufacturing remains as it is, the EOG inside the thermoelectric film is approximately 1.6 wt %.

<Example 5> Thin Film Manufacturing-5

A thermoelectric film was manufactured by performing example 1 in the same manner except for using 1.6 wt % of EOG in step 1 of example 1 and using 78.0 wt % of the thermoelectric powder. When the graphene oxide used for manufacturing remain as it is, the EOG inside the thermoelectric film is approximately 2.0 wt %.

In the examples above, the graphene oxide is further added by approximately 0.2 wt % considering a loss during a process.

Comparative Example 1

Step 1: A thermoelectric film forming paste was manufactured by mixing 20 wt % of an organic binder (1 wt % of ethyl cellulose and 99 wt % of a-terpineol) and 80 wt % of thermoelectric powder composed of Bi—Sb—Te.

Step 2: A thick film-shaped thermoelectric film was manufactured by manually printing the thermoelectric film forming paste manufactured in step 1 above by a thickness of 400 μm, removing the organic binder present inside through two-stage heat treatment (at a temperature of 60° C. for two hours and at a temperature of 400° C. for four hours), and performing sintering between thermoelectric powder particles.

Comparative Example 2

Step 1: A thermoelectric film forming paste was manufactured by mixing: a paste in which 0.9 wt % of a graphene oxides and water were mixed; 20 wt % of an organic binder (1 wt % of ethyl cellulose and 99 wt % of a-terpineol); and 78.8 wt % of thermoelectric powder composed of Bi—Sb—Te.

Step 2: A thick film-shaped thermoelectric film was manufactured by manually printing the thermoelectric film forming paste manufactured in step 1 above by a thickness of 400 μm, removing the organic binder present inside through two-stage heat treatment (at a temperature of 60° C. for two hours and at a temperature of 400° C. for four hours), and performing sintering between thermoelectric powder particles. When the graphene oxides used for manufacturing remain as it is, the graphene oxide inside the thermoelectric film is approximately 1.2 wt %.

Comparative Example 3

A thermoelectric film was manufactured by performing comparative example 2 in the same manner except for using 1.6 wt % of graphene oxides in step 1 of comparative example 2 and using 78.0 wt % of the thermoelectric powder. When the graphene oxides used for manufacturing remain as it is, the graphene oxide inside the thermoelectric film is approximately 2.0 wt %.

<Experimental Example 1> Morphology Analysis for Thermoelectric Film

In order to check the morphology of a thermoelectric film, the thermoelectric films of examples 1 to 5 and comparative example 1 above, the thermoelectric powder used in examples, and the graphene oxides used in examples were analyzed by a scanning electron microscope (SEM), a transmission electron microscope (TEM), an X-ray diffraction analysis method (XRD), and an X-ray photoelectron analysis (XPS) and the results are shown in FIGS. 2 to 6.

Figure 2A:
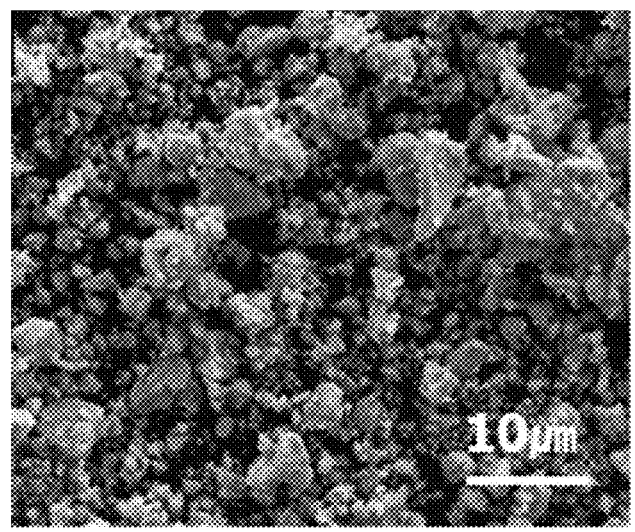
FIG. 2A is a scanning electron microscope (SEM) photograph of Bi—Sb—Te thermoelectric powder used in manufacturing a thermoelectric film.
Figure 2B:
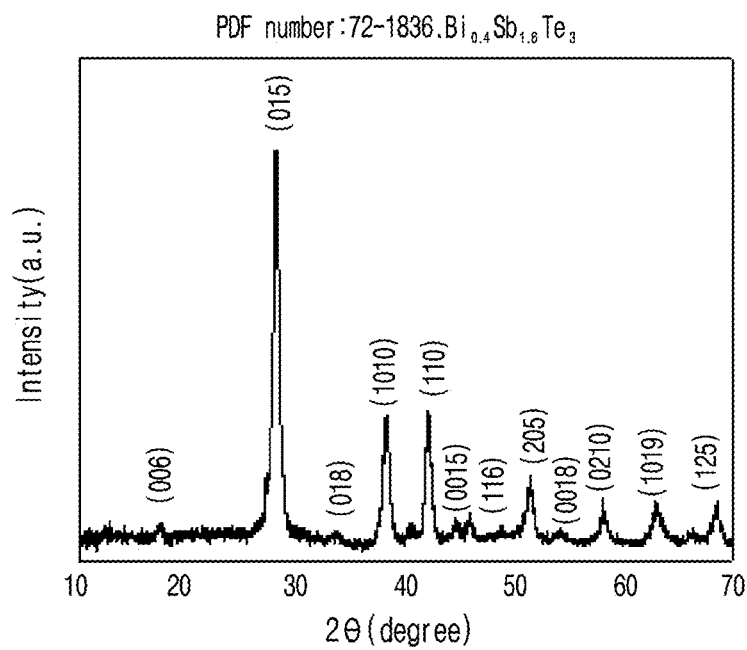
FIG. 2B illustrates an X-ray diffraction analysis results of the thermoelectric powder.

FIG. 2 illustrates a scanning electron microscope (SEM) photograph (see FIG. 2A) of Bi—Sb—Te thermoelectric powder used in manufacturing a thermoelectric film, and an X-ray diffraction analysis results (see FIG. 2B) of the thermoelectric powder.

As illustrated in FIG. 2, it may be confirmed that the composition of the used powder is $Bi_{0.4}SiO_{1.6}Te_{3.0}$.

Figure 3A:
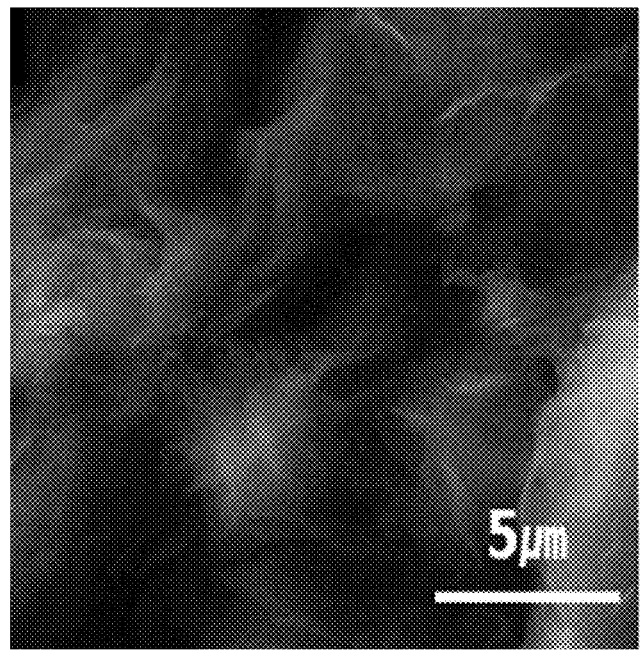
FIG. 3A is a transmission electron microscope (TEM) photograph of an edge-oxidized graphene oxide used in manufacturing a thermoelectric film.
Figure 3B:
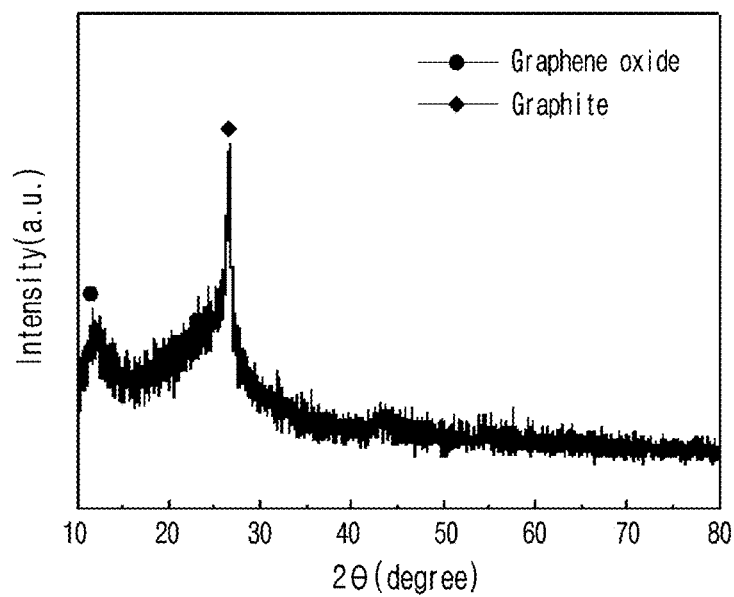
FIG. 3B illustrates an X-ray diffraction analysis results of the graphene oxide.

FIG. 3 illustrates a transmission electron microscope (TEM) photograph (see FIG. 3A) of an edge-oxidized graphene oxide used in manufacturing a thermoelectric film, and an X-ray diffraction analysis results (see FIG. 3B) of the graphene oxides.

As shown in FIG. 3, it may be confirmed that a peak that indicates the graphene oxide is shown around approximately 10.27 degrees, and a peak that means graphite around approximately 26.38 degrees is clearly shown.

Figure 4A:
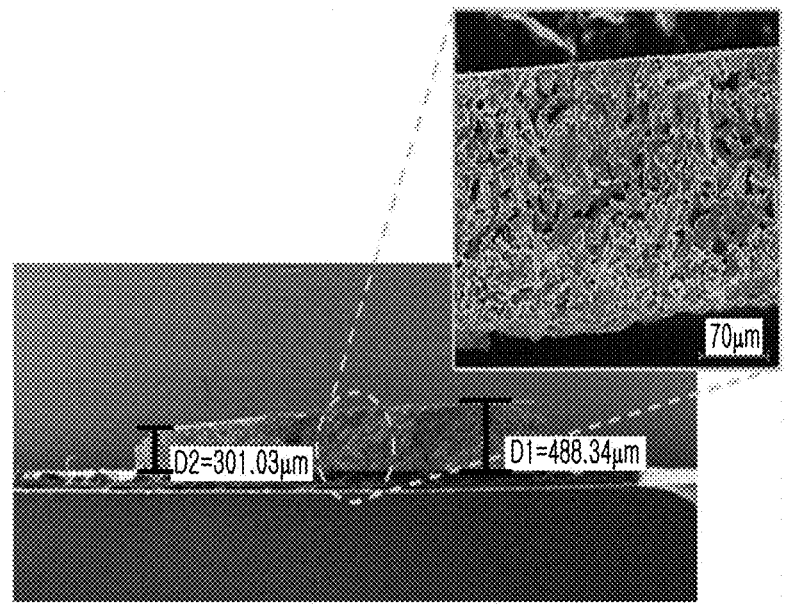
FIGS. 4A and 4B are scanning electron microscope (SEM) photographs illustrating cross-sectional microstructures of thermoelectric films manufactured in examples 1 to 5 and comparative example 1.
Figure 4B:
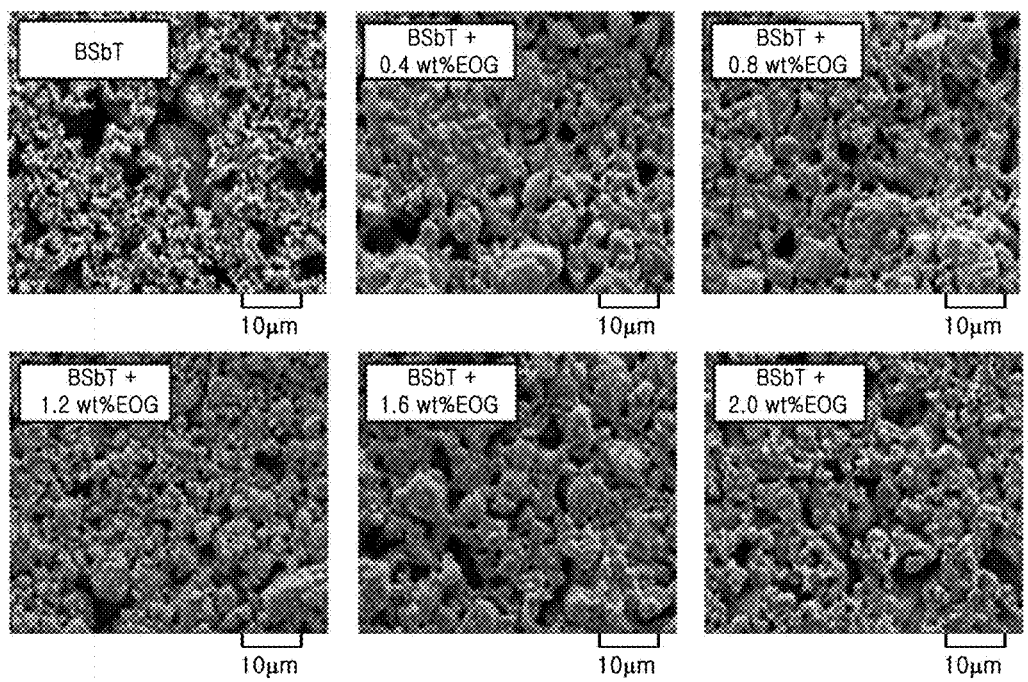

FIG. 4 is a scanning electron microscope (SEM) photograph indicating a cross-sectional microstructure of a thermoelectric film manufactured in examples 1 to 5 and comparative example 1, the cross-sectional microstructure of the thermoelectric film of example 5 is shown in FIG. 4A, and the surfaces of the thermoelectric films of examples 1 to 5 and comparative example 1 imaged at a low magnification are shown in FIG. 4B.

Figure 5:
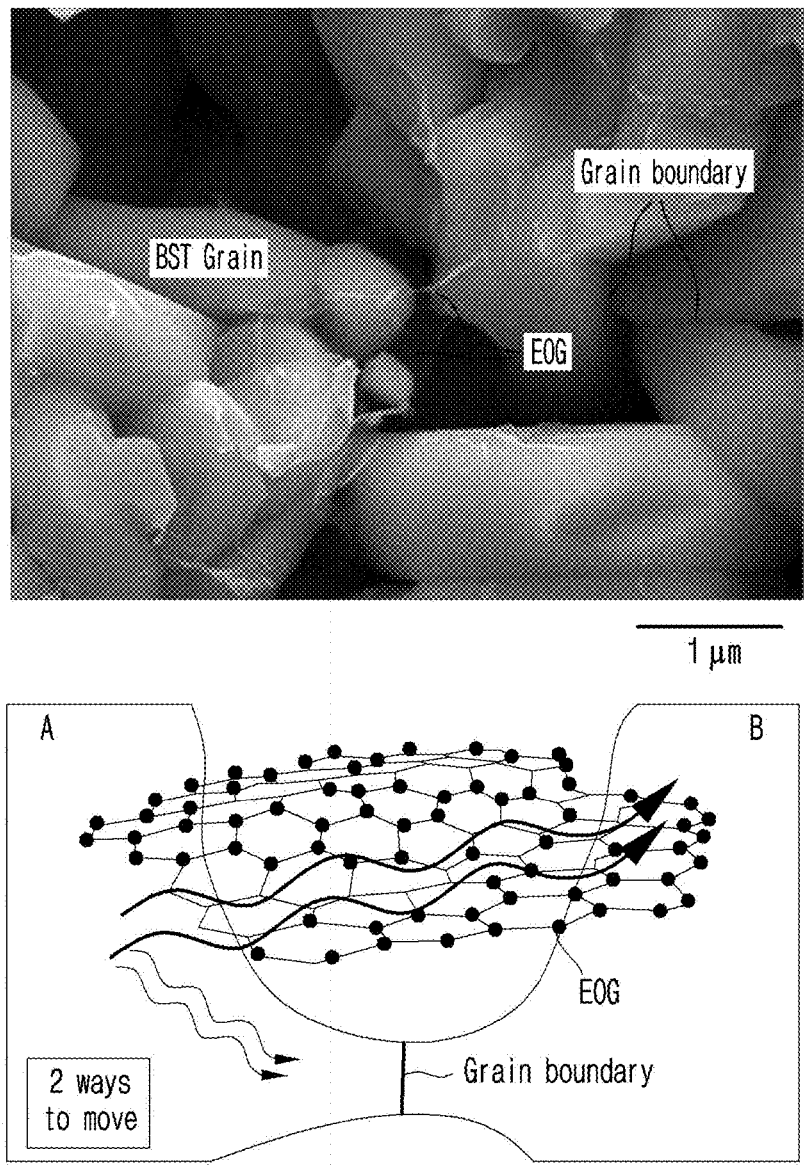
FIG. 5 is a scanning microscope photograph of fracture surface obtained by fracturing the thermoelectric film of example 5.

In addition, FIG. 5 is a photograph of a fracture surface obtained by fracturing a thermoelectric film in order to check a dispersed state of edge-oxidized graphene oxides (EGG) in the thermoelectric film of example 5.

As shown in FIG. 5, the places indicated by white arrows are just the regions in which the EOG is present, and microstructures well connected by the EOGs on the surfaces of the thermoelectric powder may be confirmed.

As confirmed in the schematic view of the left-side SEM photograph of FIG. 5, when free spaces (porous regions) inside the thermoelectric film are connected by the EOGs like bridges, a new path through which charges can quickly move inside a thermoelectric element without passing grain boundaries of the Bi—Te based thermoelectric material, and thus, it is expected that the mobility of the charges will remarkably increase.

Figure 6A:
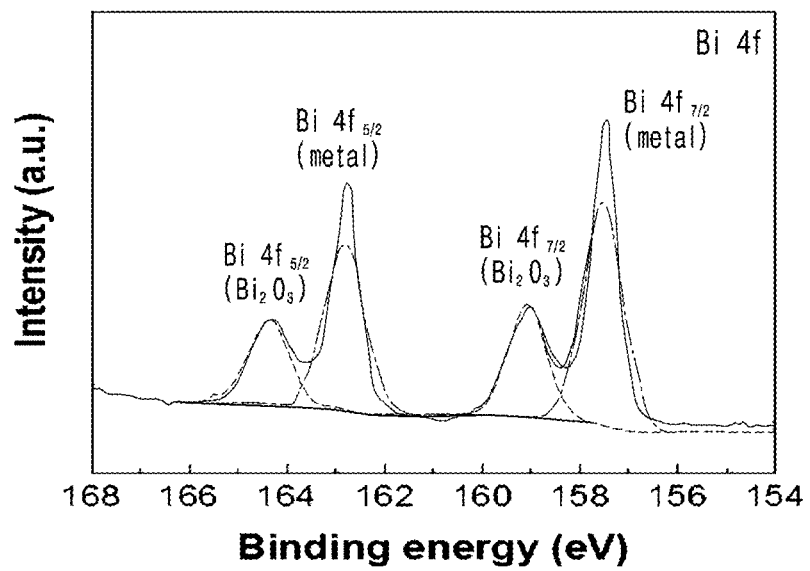
FIGS. 6A, 6B, 6C and 6D are graphs illustrating X-ray photoelectron analysis (XPS) results for the thermoelectric film of example 6.
Figure 6B:
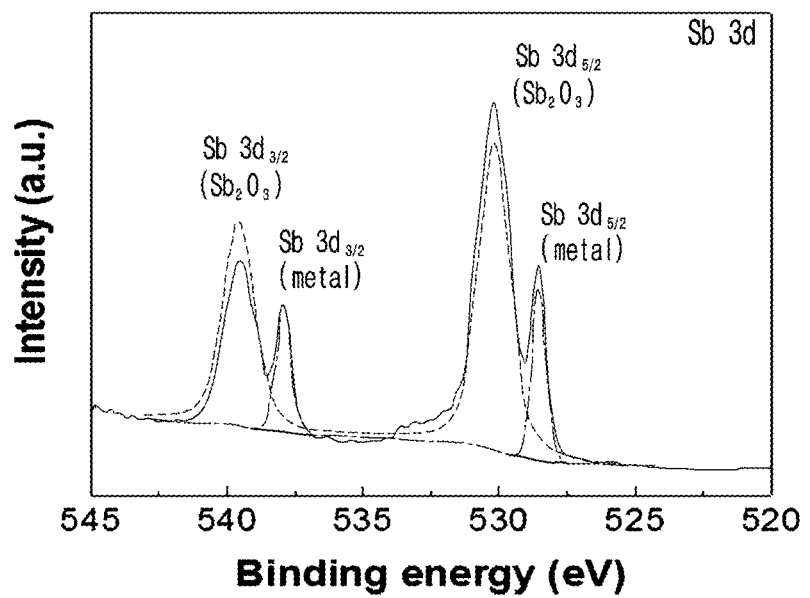
Figure 6C:
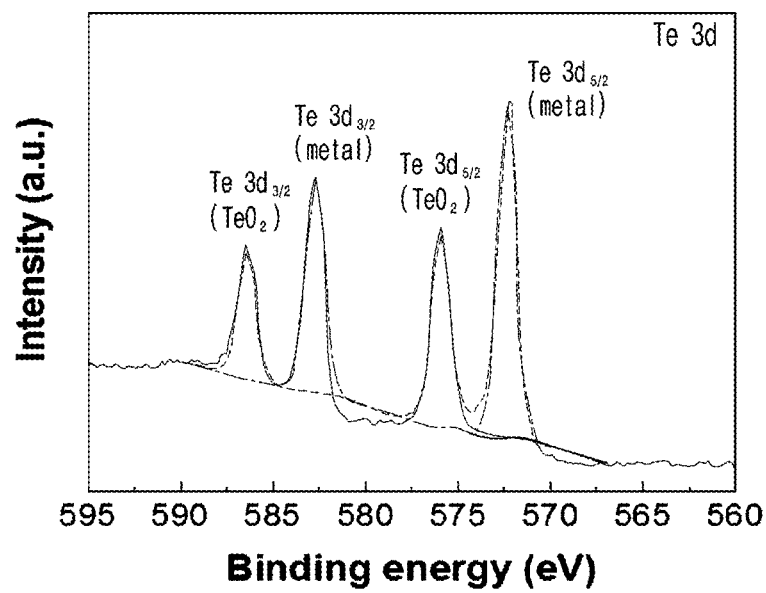
Figure 6D:
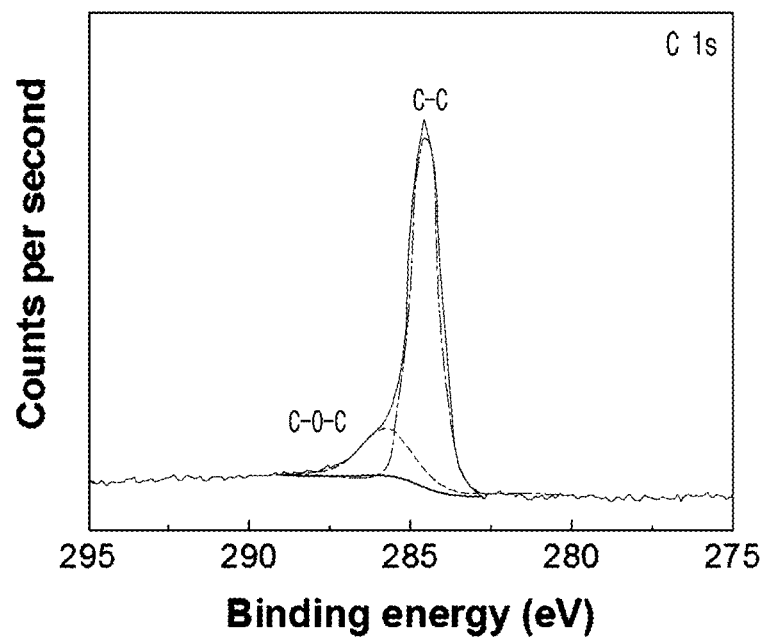

FIG. 6 is a result of an X-ray photoelectron analysis (XPS) for the thermoelectric film of example 6, and FIGS. 6A, 6B, and 6C are results of analyzing bonding energy of each of Bi, Sb and Te elements. Oxide peaks are found in all of the respective elements, and it may be confirmed that a bonding structure such as C—O—C are found in FIG. 6D as a result of analyzing C element. Accordingly, Bi, Sb, and Te elements present inside a thermoelectric thick film show possibility of being bonded to O attached to C as a functional group. Actually, in case of an EOG, when a bond is present excluding a surface oxide film, a bond may be present with oxygen present as a medium between carbon and Bi—Sb—Te. Thus, it may be explained that in a Bi—Sb—Te thermoelectric thick film containing EOGs, the EOGs are simply physically mixed and may also form chemical bonds. That is, when the EOGs are present in a porous region which is not completely sintered inside the thick film, a shape may be expected in which both end portions of the EGGS are attached between the crystals of Bi—Sb—Te in a chemically bonded form.

<Experimental Example 2> Performance Analysis of Thermoelectric Film

In order to check the performance of a thermoelectric film according to the present invention, the electrical conductivity, the Seebeck coefficient, the charge density, a change in the charge mobility, and the power factor of the thermoelectric films of examples 1 to 5 and comparative examples 1 to 3 are analyzed, and the results thereof are shown in FIGS. 7 to 10.

Figure 7:
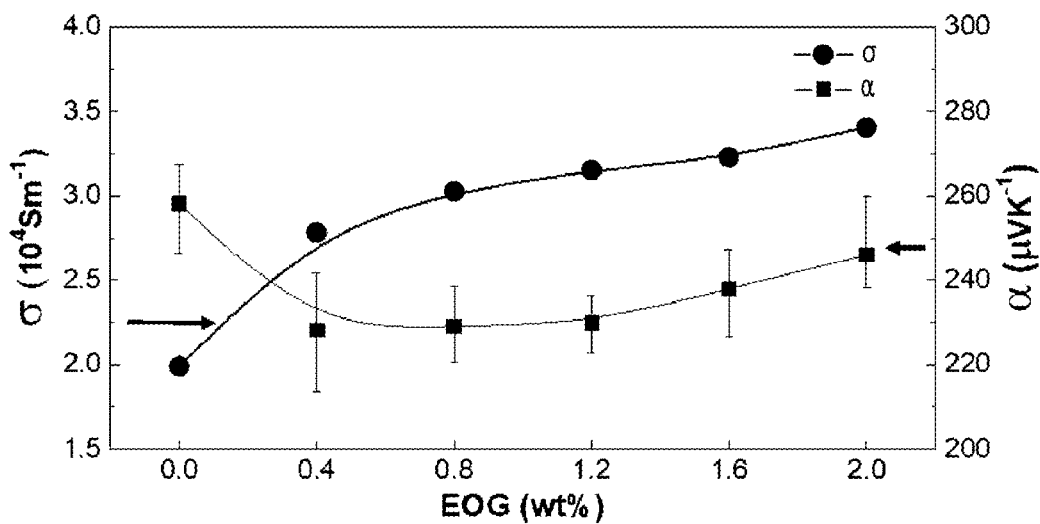
FIG. 7 is a graph illustrating the electrical conductivity and Seebeck coefficient according to the contents of EOG of the thermoelectric films of examples 1 to 5 and comparative example 1.

As shown in FIG. 7, the thermoelectric film (example 5) including 2.0 wt % of the EOGs exhibits an electrical conductivity value improved by maximum of 1.5 times ($2\times10^4$ $Sm^{-1}$ to $3.5\times10^4$ $Sm^{-1}$) compared to the thermoelectric film (comparative example 1) in which no EOG is added. On the other hand, in case of the Seebeck coefficient, a slight decreasing tendency is shown according to addition of the EOG, but it may be understood that no further decrease is shown at a level of 230-260 µV/K.

Figure 8:
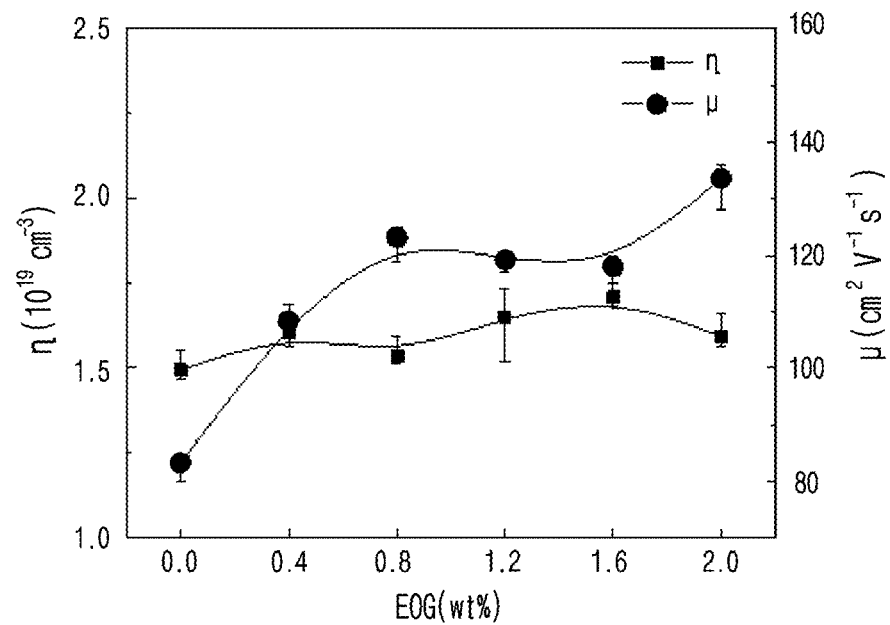
FIG. 8 is a graph illustrating the charge density and charge mobility according to the contents of EOG of the thermoelectric films of examples 1 to 5 and comparative example 1.

As shown in FIG. 8, consequently, it is confirmed that the improvement in electrical conductivity is due to the mobility of charges which is improved according to the addition of EOGs. On the other hand, the charge density does not show a large change. Accordingly, it may be understood that the role of the thermoelectric film including EOGs is to improve with a high speed the mobility of charges without substantially affecting the charge density.

Figure 9:
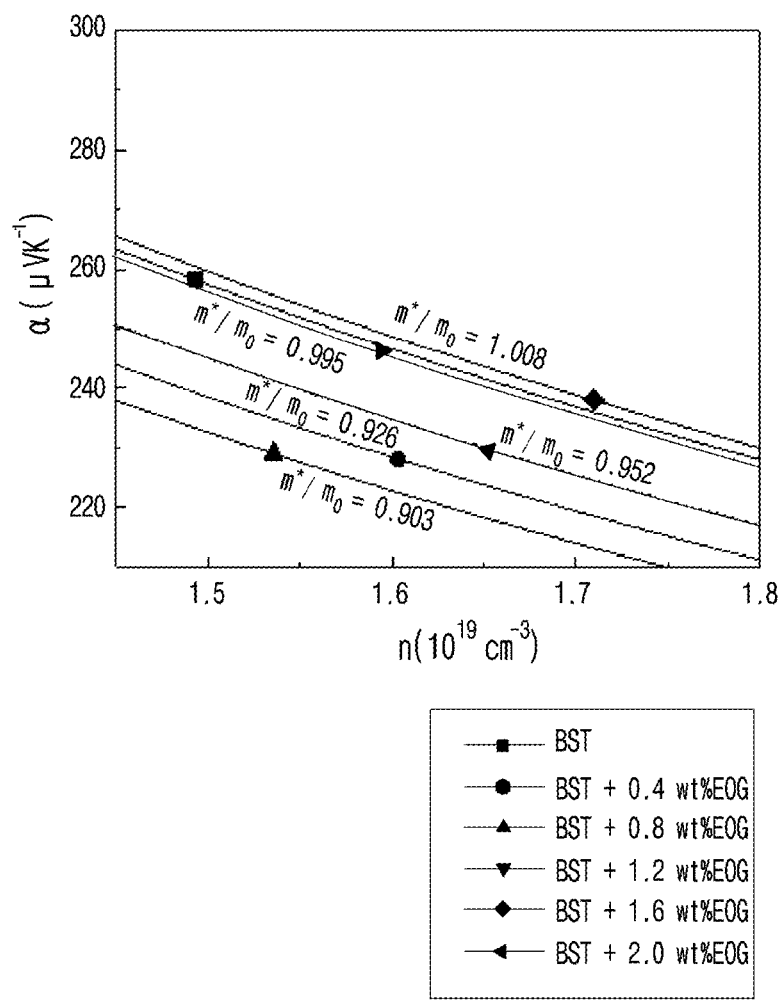
FIG. 9 is a graph illustrating the correlation between the charge density and Seebeck coefficient according to the contents of EOG of the thermoelectric films of examples 1 to 5 and comparative example 1.

In addition, it may be inferred that the small change in the Seebeck coefficient is also caused by the effective mass m* and the charge density which do not remarkably change as shown in FIG. 9 regardless of addition of EOGs.

Figure 10:
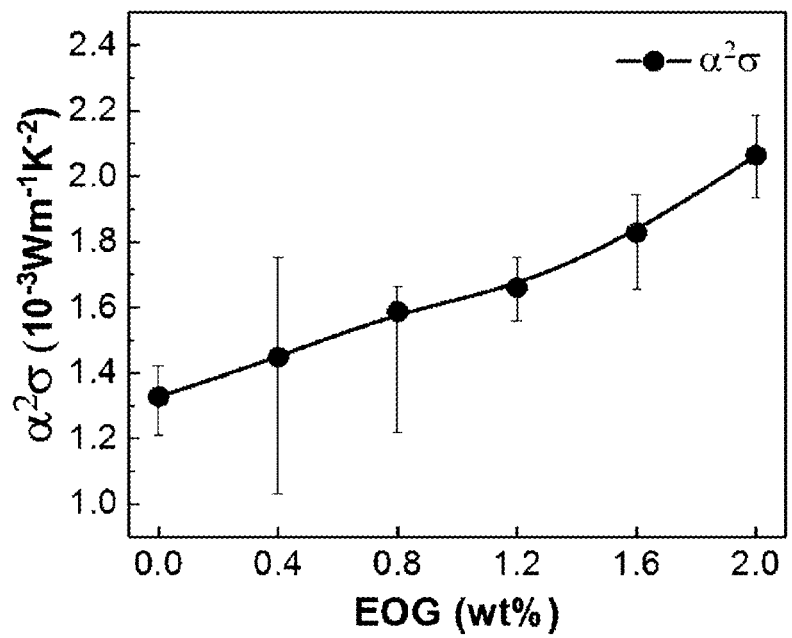
FIG. 10 is a graph illustrating the power factors according to the contents of EOG of the thermoelectric films of examples 1 to 5 and comparative example 1.

Finally, as shown in FIG. 10, it may be confirmed that the power factor $\sigma \cdot \alpha^2$ among the thermoelectric performance indexes is improved.

Figure 11:
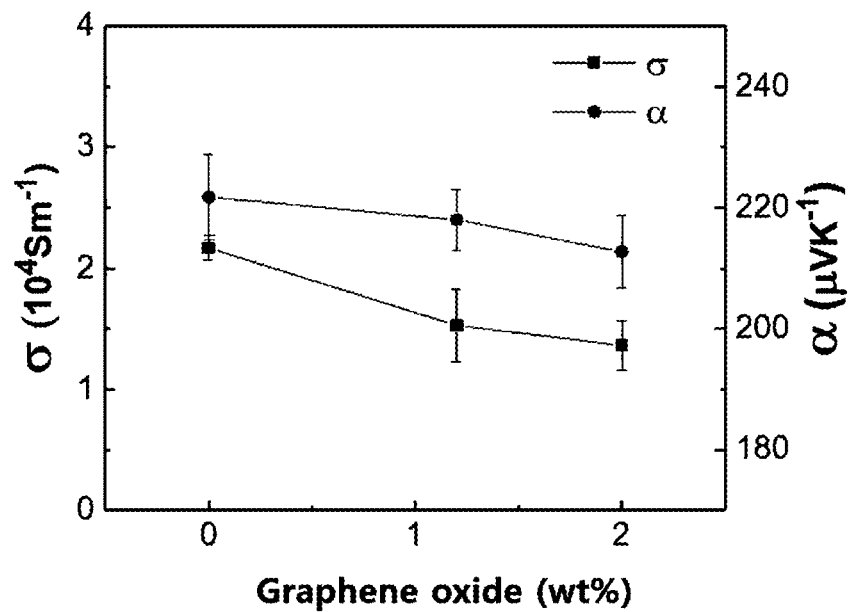
FIG. 11 is a graph illustrating the electrical conductivity and Seebeck coefficient according to the contents of EOG of the thermoelectric films of comparative examples 2 and 3.

On the other end, when a graphene oxide oxidized up to a basal plane or a graphene oxide is used (comparative examples 2 and 3), the electrical conductivity obviously decreases as shown in FIG. 11. This is because much oxidization occurs even in the basal plane that deals with charge movements unlike the EOG, and defect is caused, and thus, the electrical conductivity of the graphene itself decreased.

The thick film-type thermoelectric film material describe so far may be implemented as a small element and by virtue of the degree of freedom in shapes and small thicknesses, may be used for cooling/heating devices for existing internal combustion engine vehicles, and hybrid and electric vehicles (e.g., personal cooling/heating device, dehumidifiers, battery heat management components, etc.), for independent power supply device for mobile apparatuses using heat of animals or human body, for various self power generation devices, for infrared sensors, or the like.

A composition for forming a thermoelectric film provided in an aspect of the present invention is a two-dimensional graphene, and a unique superior charge mobility may be exhibited by applying an edge-oxidized graphene oxide. Thus, thermoelectric materials are bridged in which the graphene oxide is not completely sintered and is not attached inside a thick film, and thus, a new path through which charges can quickly move is provided and an effect of improving electrical conductivity may be secured. In addition, since scattering of phonons is expected on an interface formed between the graphene oxide and the thermoelectric material, an effect of reducing thermal conductivity due to lattice phonons may be expected.

Accordingly, even when synthesis of paste and an existing technique of a printing process using the paste is used as it is and some pore structures are present, the edge-oxidized graphene oxide covers the pores and thus, a thick film-type thermoelectric film having superior conductivity may be manufactured, and there is an effect in that when the film is made into a thick film element, a thermoelectric element having improved performance can be manufactured.

What is claimed is:

1. A thermoelectric thick film consisting of a thermoelectric material, and an edge-oxidized graphene oxide, wherein the thermoelectric material is one or more selected from the group consisting of a Bi—Te based compound, an Sb-Tb based compound, a Bi—Sb—Te based compound, a Bi—Te—Se based compound, a Co—Sb based compound, a Pb—Te based compound, a Ge—Tb based compound, an Si—Ge based compound and an Sm—Co based compound, wherein the edge oxidized graphene oxide is dispersed in the thermoelectric material, and the content of the edge oxidized graphene oxide is greater than 0.5 parts by weight and 10 parts by weight or less with respect to 100 parts by weight of the total thermoelectric thick film.

2. The thermoelectric thick film of claim 1, wherein the thickness of the thermoelectric film is 100 µm to 900 µm.

3. The thermoelectric thick film of claim 1, wherein the edge-oxidized graphene oxide is dispersed on a surface or in an inside of the thermoelectric material to connects a porous region formed inside the thermoelectric film and provide a new charge movement path.

4. A cooling/heating device, comprising the thermoelectric thick film of claim 1, for internal combustion engine vehicles, hybrid vehicles, and electric vehicles.

5. An electronic material applied to one selected from the group consisting of an independent power supply device of a mobile device, a self power generation device, and an infrared sensor which comprise the thermoelectric thick film of claim 1.

* * * * *